(12) United States Patent
Russberg et al.

(10) Patent No.: US 8,304,957 B2
(45) Date of Patent: Nov. 6, 2012

(54) THERMOMAGNETIC GENERATOR DEVICE AND ENERGY CONVERTING METHOD

(75) Inventors: Gunnar Russberg, Västerås (SE); Mikael Dahlgren, Västerås (SE); Stefan Thorburn, Västerås (SE)

(73) Assignee: ABB Research Ltd., Zürich (CH)

( * ) Notice: Subject to any disclaimer, the term of this patent is extended or adjusted under 35 U.S.C. 154(b) by 384 days.

(21) Appl. No.: 12/593,350

(22) PCT Filed: Mar. 18, 2008

(86) PCT No.: PCT/EP2008/053221
§ 371 (c)(1),
(2), (4) Date: Sep. 28, 2009

(87) PCT Pub. No.: WO2008/116792
PCT Pub. Date: Oct. 2, 2008

(65) Prior Publication Data
US 2010/0109474 A1     May 6, 2010

(30) Foreign Application Priority Data
Mar. 28, 2007 (SE) ........................ 0700781

(51) Int. Cl.
*H01L 37/04* (2006.01)
(52) U.S. Cl. .................................................... 310/306
(58) Field of Classification Search ............ 310/306; 136/205–212, 224
See application file for complete search history.

(56) References Cited

U.S. PATENT DOCUMENTS

| | | |
|---|---|---|
| 380,100 A | 3/1888 | Edison |
| 428,057 A | 5/1890 | Tesla |
| 2,510,801 A | 6/1950 | Chilowsky |
| 6,725,668 B1 | 4/2004 | Cornwall |
| 7,098,547 B1 * | 8/2006 | Burns ............ 290/1 R |
| 2002/0124561 A1 | 9/2002 | Ban et al. |
| 2007/0227572 A1 * | 10/2007 | Piasecki et al. ........ 136/205 |

FOREIGN PATENT DOCUMENTS

| | | |
|---|---|---|
| CH | 662020 A5 | 8/1987 |
| DE | 2347377 A1 | 4/1975 |
| GB | 674284 A | 6/1952 |
| JP | 07107764 A | 4/1995 |
| WO | WO-2008/116785 A1 | 10/2008 |
| WO | WO-2008/116789 A1 | 10/2008 |

(Continued)

OTHER PUBLICATIONS

Marcus, CH662020 Machine Translation, Aug. 1987.*

(Continued)

*Primary Examiner* — Quyen Leung
*Assistant Examiner* — Eric Johnson
(74) *Attorney, Agent, or Firm* — Venable LLP; Eric J. Frankin

(57) ABSTRACT

A generator device for converting thermal energy to electric energy. A magnetic circuit includes at least a portion made of a magnetic material. A temperature-varying device varies the temperature in the portion made of the magnetic material alternately above and below a phase transition temperature of the magnetic material to thereby vary the reluctance of the magnetic circuit. A coil is arranged around the magnetic circuit, in which electric energy is induced in response to a varying magnetic flux in the magnetic circuit. A magnetic flux generator generates magnetic flux in the magnetic circuit. A controllable electric circuit device is connected to the coil and a control device controls the controllable electric circuit device.

10 Claims, 3 Drawing Sheets

FOREIGN PATENT DOCUMENTS

WO   WO-2008/118063 A1   10/2008

OTHER PUBLICATIONS

Dan Solomon; "Design of a Thermomagnetic Generator"; Energy Conversion Management; vol. 31, No. 2; pp. 157-173; 1991.

Dan Solomon; "Improving the performance of a thermomagnetic generator by cycling the magnetic field"; J. Appl. Phys. 63 (3); pp. 915-921; Feb. 1, 1988.

J. E. Elliott; "Thermomagnetic generator" J. Appl. Phys. 30 (11); pp. 1774-1777; Nov. 1959.

PCT/ISA/210—International Search Report—Aug. 7, 2008.

PCT/ISA/201—International-Type Search Report—Nov. 30, 2007.

PCT/ISA/237—Written Opinion of the International Searching Authority—Aug. 7, 2008.

\* cited by examiner

THERMOMAGNETIC GENERATOR DEVICE AND ENERGY CONVERTING METHOD

CROSS-REFERENCE TO RELATED APPLICATIONS

This application claims priority to Swedish patent application 0700781-8 filed 28 Mar. 2007 and is the national phase under 35 U.S.C. §371 of PCT/EP2008/053221 filed 18 Mar. 2008.

TECHNICAL FIELD OF THE INVENTION

The present invention generally relates to a generator device and method for converting thermal energy to electric energy.

DESCRIPTION OF RELATED ART AND BACKGROUND OF THE INVENTION

Apparatuses for transforming thermal energy directly into electric energy using a minimum of moving parts have been known since long.

At the end of the 19'th century, Edison and Tesla described devices based on thermomagnetic materials for converting thermal energy into electricity. Edison's pyro-magnetic generator as described in U.S. Pat. No. 380,100 includes a thermomagnetic working material, means for magnetizing the working material, sources of heat and cold connected to the working material, and a winding enclosing the working material and in which an alternating electric current is induced by thermally cycling the working material. Tesla discloses in U.S. Pat. No. 428,057 some improvements of Edison's generator by suggesting an alternative heat exchanging mechanism.

Chilowsky discloses in U.S. Pat. No. 2,510,801 a device for thermomagnetic energy conversion, wherein the temperature variations are achieved by hot and cold fluids in a closed fluid circuit.

Bartels discloses in German patent No. 23 47 377 a device similar to Edison's generator, but suggests gadolinium as magnetic working medium. In one embodiment a permanent magnet is provided to create the magnetic flux in the thermomagnetic material and in another embodiment a battery is used to induce a current in a coil to thereby form an electromagnet to create the magnetic flux.

While the apparatuses described above do convert thermal energy directly to electric energy, they seem not to be efficient, compact, optimized for practical use, and/or cost-efficient to manufacture.

SUMMARY OF THE INVENTION

It is an object of the present invention to provide a generator device for converting thermal energy to electric energy, which has a simplified, yet improved, structure and operation.

It is a particular object of the invention to provide such a device and a method for converting thermal energy to electric energy, which provide for efficient conversion of energy.

It is a further object to provide such a device and method, which are dynamically controllable, reliable, flexible, and of reasonable cost.

These objects, among others, are according to the present invention attained by generator devices and methods as specified in the appended patent claims.

According to one aspect of the invention there is provided a generator device for converting thermal energy to electric energy, which comprises a magnetic circuit including at least a portion made of a magnetic material. A temperature-varying apparatus is provided for varying the temperature in the portion made of the magnetic material alternately above and below a phase transition temperature, preferably the Curie or Néel temperature, of the magnetic material to thereby vary the reluctance of the magnetic circuit. A device such as a permanent magnet or electromagnet creates a magnetic flux in the magnetic circuit, which is modulated by the varying reluctance. A coil is arranged around the magnetic circuit, in which electric energy is induced in response to the varying magnetic flux in the magnetic circuit. A controllable load or power electronic circuit device is connected to the coil and a control device is provided for controlling the controllable load.

Such a generator device is compact and requires no moving or rotating mechanical parts. The controllable load is controlled to optimize the performance of the generator device. Hereby, an efficient conversion of thermal energy to electric energy is obtained.

Further the controllable load may be used for a variety of purposes. In one embodiment of the invention the controllable load has an inductive/capacitive component and a resistive (active) component, wherein each of the components is separately and individually controllable.

In another embodiment of the invention the controllable load has an impedance, whose amplitude and phase are dynamically controllable.

In yet another embodiment of the invention the controllable load is capable of adjusting the active power of the generator device and the control device is provided for controlling the active power of the generator device via the controllable load.

In still another embodiment of the invention a capacitor is connected in parallel with the coil to thereby form a resonant electric circuit and the controllable load is provided for initiating resonant oscillations in the resonant electric circuit.

The controllable load may be implemented as any or a combination of a number of devices: an AC/AC frequency converter, a power electronic converter, a voltage source converter, a current source converter, and an AC/DC converter.

The control device may further be used for controlling the amplitude and frequency of the variation of the temperature in the portion made of the magnetic material alternately above and below the phase transition temperature of the magnetic material.

According to another aspect of the invention there is provided a method for converting thermal energy to electric energy in a generator device comprising a magnetic circuit including at least a portion made of a magnetic material and a coil (7) arranged around the magnetic circuit. According to the method the temperature is varied in the portion made of the magnetic material alternately above and below a phase transition temperature of the magnetic material to thereby vary the reluctance of the magnetic circuit. The magnetic circuit is magnetized and the magnetic flux achieved is modulated by the varying reluctance. Electric energy is induced in the coil in response to the varying magnetic flux in the magnetic circuit. The method further encompasses the steps of connecting a controllable load to the coil and controlling the controllable load from a control device.

The present invention is suitable for a large variety of electric power generation by using for example any of waste heat, combustion heat, thermal storage reservoir energy, geothermal energy, solar radiation, solar thermal energy, ocean thermal energy, or energy from nuclear reactions.

Further characteristics of the invention and advantages thereof, will be evident from the following detailed description of preferred embodiments of the present invention given hereinafter and the accompanying FIGS. 1-6, which are given by way of illustration only and thus, are not limitative of the present invention.

DETAILED DESCRIPTION OF EMBODIMENTS

Figure 1:
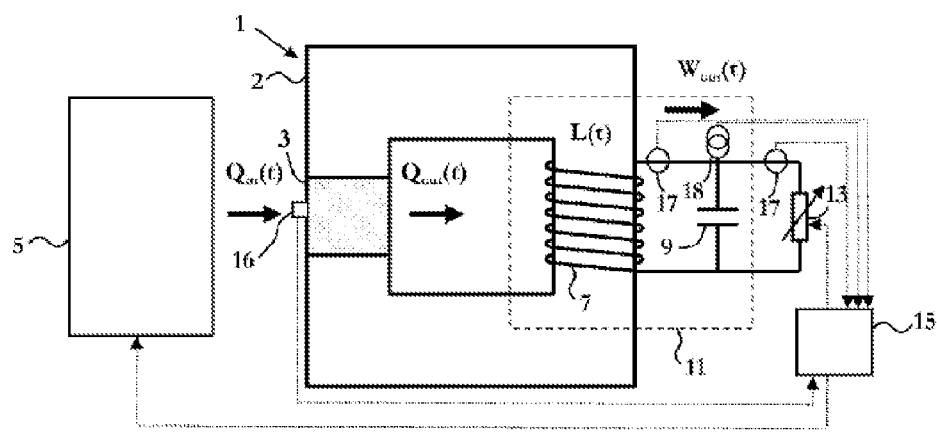
FIG. 1 displays schematically a thermomagnetic generator device according to an embodiment of the present invention.

A thermomagnetic or magnetothermal generator device for direct transformation of heat into electric energy according to an embodiment of the present invention comprises, as shown in FIG. 1, a magnetic ring or circuit 1, a temperature-varying device 5, and a coil or winding 7 arranged around the magnetic circuit 1.

The magnetic circuit may be substantially of iron or other magnetic material 2, but includes at least a portion 3 made of a magnetic material, which has a suitable phase transition temperature, e.g. in the interval 0-100° C. Alternatively, an essential portion of the magnetic circuit or the entire circuit is of the magnetic material with the suitable phase transition temperature.

The temperature-varying device 5 is provided for varying the temperature in the portion made of the magnetic material with the suitable phase transition temperature alternately above and below a magnetic phase transition temperature of the magnetic material preferably with a frequency of about or above 1 Hz. Temperature-varying devices that can be used in the present information will be described later in this description. Examples of magnetic phase transition temperatures are the Curie temperature and the Néel temperature.

The rapid variation of temperature above and below the phase transition temperature causes drastic changes of the permeability of the magnetic material and thus a rapid variation of the magnetic resistance or reluctance of the magnetic circuit 1. More concretely, the magnetization is varied rapidly when a constant magnetic field is applied.

Provided that a magnetic flux is provided in the magnetic circuit 1, the rapid variation of the reluctance will modulate the magnetic flux, thereby obtaining a rapidly varying magnetic flux in the magnetic circuit 1. As a result a magnetomotive force and an alternating current are obtained in the coil 7.

The magnetic flux can be provided by a permanent magnet or, as in FIG. 1, by an electromagnet.

The current for the electromagnet is advantageously taken from the current induced in the coil in a novel manner. To this end, a capacitor 9 is connected in parallel with the coil 7 to thereby form a resonant electric circuit 11, wherein the frequency of the temperature variation above and below the phase transition temperature of the magnetic material is adjusted to optimize the resonant energy transfer to the resonant electric circuit 11.

Advantageously, the ratio of the resonance frequency of the resonant electric circuit 11 and the frequency of the temperature variation above and below the phase transition temperature of the magnetic material is approximately ½ or n/2, where n is a positive integer.

Hereby, a single coil will be used for the transformation of heat to electric energy and for providing a magnetic flux in the magnetic circuit 1. Such fields of alternating directions provides for a more cost efficient apparatus.

A part, e.g. a major part, of the current/charge induced in one half of a first thermal cycle is stored by the capacitor 9 and is used in the following half of the first thermal cycle to generate a magnetic flux in the magnetic circuit 1. This first thermal cycle corresponds to one half of an electric cycle. The procedure is repeated through a second thermal cycle with current and voltage 180 degrees phase shifted.

In order to be capable of controlling the resonance frequency, and the reactance of the electric circuit formed by the coil 7 and the capacitor 9, a fully controllable load or power electronic circuit device 13 is connected over the capacitor 9. Preferably, the load has an inductive component/capacitive component and a resistive component, each of which being separately and individually controllable. Advantageously, the load can be used to adjust the active power. A suitable control device 15 is provided for controlling the load 13. Different measurement devices, such as a thermo sensor 16, current transformers 17, and a voltage transformer 18 may be provided to supply the control device 15 with suitable measurement data. The thermo sensor 16 may supply the control device 15 with temperature data instantaneously measured in or at the magnetic material with the suitable phase transition temperature or in or at the temperature-varying device 5. The transformers 17, 18 may supply the control device 15 with voltage and current data instantaneously measured in the resonant electric circuit 11.

Hereby, the amplitude and phase of the impedance of the load can be dynamically controlled. The frequency and period of a variation of the impedance is controllable, and so is the frequency and period of the resonance of the resonant circuit 11.

Further, the control device 15 may be configured to control the amplitude and frequency of the rapid variation of the temperature above and below the phase transition temperature.

Still further, the control device 15 may be provided to initiate the operation of the generator device, i.e. to start the resonant oscillations, e.g. by delivering a current pulse to the magnetic circuit 1.

The generator device described above may be compact without essentially any moving parts and without any conversion to or from mechanical energy. Operation is easily controlled and efficiency may be optimized by adjusting the output power during a cycle.

It shall be appreciated that a plurality of the generator device of FIG. 1 can be connected together to form a multiphase generator device. For instance three generator devices of FIG. 1 may be connected together and be phase-shifted 120° with respect to one another to form a three-phase generator device.

Figure 2:
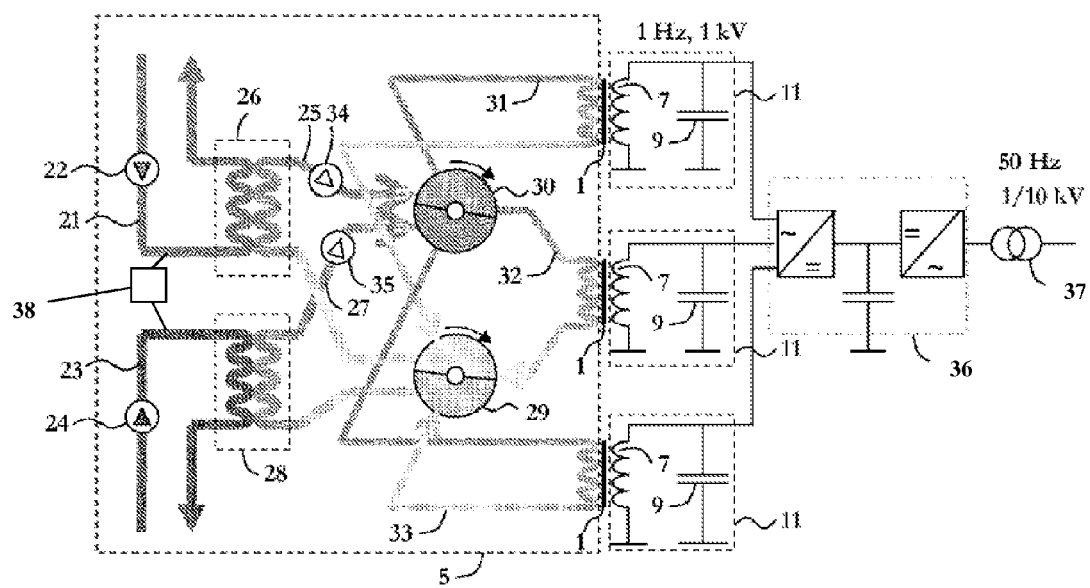
FIG. 2 displays schematically a thermomagnetic generator device according to a further embodiment of the present invention.

With reference next to FIG. 2, a multiphase thermomagnetic generator device according to a further embodiment of the present invention will be shortly overviewed.

This embodiment uses the same reference numerals as the previous embodiment to indicate similar parts and details.

Three only schematically indicated magnetic circuits 1 are provided, each of which being of the kind described with reference to FIG. 1 and each of which being operatively connected to a respective LC circuit 11 including a winding or coil 7 and a capacitor 9 connected in parallel. The resonance frequency each of the LC circuits 11 is as before essentially similar to the frequency of the temperature variation as created by the temperature-varying device 5.

The temperature-varying device 5 comprises an outer part, which includes a first external pipe arrangement 21, in which hot fluid is circulated by a feed pump 22, and a second external pipe arrangement 23, in which cold fluid is circulated by a feed pump 24. The hot and cold fluids of the outer part are entirely isolated from each other as well as from the material of the magnetic circuits 1.

The hot fluid in the first external pipe arrangement 21 transfers heat to fluid in a first intermediate pipe arrangement 25 via a first heat exchanger 26 and the cold fluid in the second external pipe arrangement 23 transfers cold to fluid in a second intermediate pipe arrangement 27 via a second heat exchanger 28. Each of the first and second intermediate pipe arrangements 25, 27 is connected between a first valve arrangement 29 and a second valve arrangement 30 to transport fluid from the first valve arrangement 29 to the second valve arrangement 30. The first and second valve arrangements 29, 30 are advantageously based on rotating valves, examples of which being disclosed in FIGS. 3-4.

It shall be appreciated that the outer part may be exchanged for any other kind of arrangement for transferring heat and cold in the heat exchangers 26 and 28. For instance, heat may be transferred to fluid in the first intermediate pipe arrangement 25 in the first heat exchanger 26 via an incinerator, hot sand, a solar heating panel, or similar.

Finally, a first 31, a second 32, and a third internal pipe arrangement are each connected between the second valve arrangement 30 and the first valve arrangement 29 via a respective one of the magnetic circuits 1.

A single fluid is flowing in the inner part of the temperature-varying device 5, which comprises the intermediate and internal pipe arrangements and the first and second valve arrangements. The inner part thus provides a closed fluid loop.

The second valve arrangement 30 is provided for alternately switching hot fluid from the first intermediate pipe arrangement 25 and cold fluid from the second intermediate pipe arrangement 27 into each one of the first, second and third internal pipe arrangements 31, 32, 33, preferably with a 120° phase shift there in between. Thus, the second valve arrangement 30 "chops" the hot and cold fluids and forms trains of alternating hot and cold fluid pulses, which are fed into each of the internal pipe arrangements. As the hot and cold fluid pulses pass by, or through holes in, a magnetic material of the magnetic circuits 1, the magnetic material will be alternately heated above and cooled below the phase transition temperature as was described above in connection with the embodiment of FIG. 1.

The terms "hot fluid" and "cold fluid" as used in the present text are intended to indicate "fluid having a temperature above the phase transition temperature of the magnetic material of the portion 3 of the magnetic circuit" and "fluid having a temperature below the phase transition temperature of the magnetic material of the portion 3 of the magnetic circuit", respectively.

The magnetic material can be provided as parallel sheets or plates preferably arranged in parallel to one another, granulates, small spheres, wires, fabrics or similar allowing the fluid, in a laminar or turbulent flow, to exchange heat with the magnetic material with large contact surface.

After having passed the magnetic material the temperature variation between the hot and cold fluid pulses is smaller and smoother. The trains of hot and cold fluid pulses are then returned in the respective internal pipe arrangements 31, 32, to the first valve arrangement 29, which is synchronized with the trains of hot and cold fluid pulses.

The first valve arrangement 29 is thus provided for alternately switching the hotter fluid pulses from the first, second and third internal pipe arrangements 31, 32, 33 into the first intermediate pipe arrangement 25 and the colder fluid pulses from the first, second and third internal pipe arrangements 31, 32, 33 into the second intermediate pipe arrangement 27. Hereby, the hotter and colder fluid pulses are returned to the respective intermediate pipe arrangement, from which they were originating. The fluid in the first intermediate pipe arrangement 25 is then returned to the first heat exchanger 26 in order to be heated again and the fluid in the second intermediate pipe arrangement 27 is then returned to the second heat exchanger 28 in order to be cooled again.

The fluid in the inner part is driven in a single direction by feed pumps 34, 35.

The rotating valves 29, 30 of FIG. 2 are advantageously mounted on a single shaft to be rotated simultaneously/synchronously with a suitable phase shift there in between.

In an alternative embodiment the first valve arrangement 29, particularly where the temperature difference between the hotter and colder fluid pulses is low, the hotter and colder fluid pulses from the first, second and third internal pipe arrangements may not have to be switched back into the second and first intermediate pipe arrangements. Thus, the first valve arrangement 29 may be dispensed with, and another kind of passive distribution or mixing arrangement may be used instead in order to return the fluids to the second and first intermediate pipe arrangement. If an open circuit is used the fluids do not have to be returned.

Figure 3:
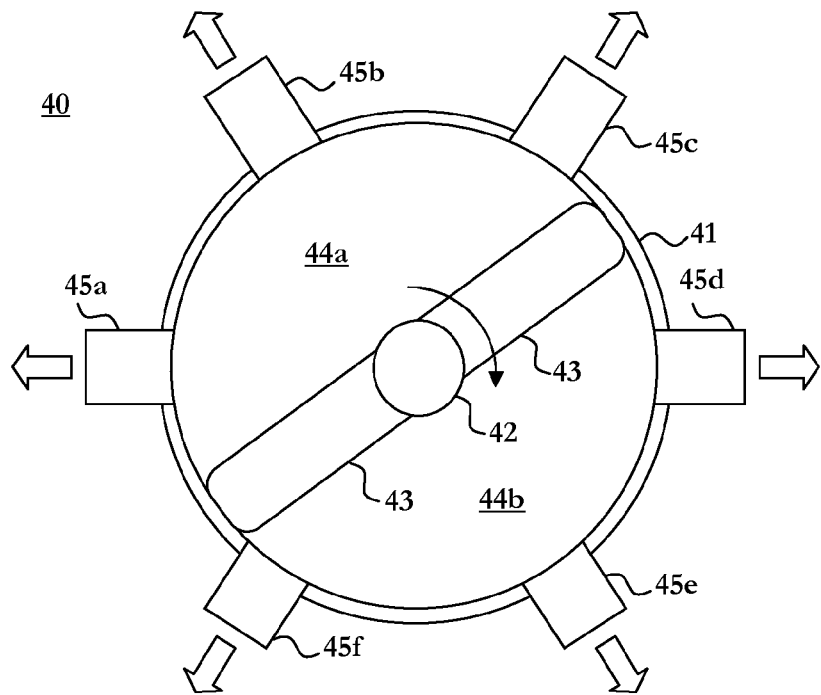
FIG. 3 displays schematically in a top view an example of a rotating valve as usable in the thermomagnetic generator device of FIG. 2.

An example of a rotating valve 40 to be used in the present invention is disclosed in FIG. 3. A hollow cylinder or cylindrical casing 41 houses a symmetrically arranged rotatable shaft 42, to which two blades or wings 43 are fixedly attached. The two blades 43, which preferably are thermally isolating, are provided in close fit with the cylindrical casing 41 and define two essentially separated and identical compartments or chambers 44*a-b* of the rotating valve. The shaft 42 and the blades 43 are advantageously mounted in the cylindrical casing 41 by means of bearings and means, e.g. an electric motor, is provided to apply a driving torque on the shaft 42. Alternatively, the driving torque is applied via an internal propeller or similar attached to the shaft 42 and/or via self-propulsion in the flow.

A first one 44*a* of the chambers is connected to the first intermediate pipe arrangement 25 and is configured to receive hot fluid from there, and the second one 44*b* of the chambers is connected to the second intermediate pipe arrangement 27 and is configured to receive cold fluid from there. To this end a respective half-circular cover plate (not explicitly illustrated) is fixedly provided with respect to the shaft 42 and the blades 43 at a respective axial end of the rotating valve, wherein the cover plates rotate with the shaft 42 and the blades 43 during operation. A first one of the cover plates covers the second chamber 44*b* and prevents hot fluid from entering the second chamber 44*b* at the axial end connected to the first intermediate pipe arrangement 25 and a second one of the cover plates covers the first chamber 44*a* and prevents cold fluid from entering the first chamber 44a at the axial end connected to the second intermediate pipe arrangement 27.

In the illustrated example six outlets 45a-f are arranged circumferentially in the casing 41, preferably with equal distances between one another. During operation, the shaft 42 and the blades 43 are steadily rotated with respect to the casing 41 and the outlets 45a-f with steady incoming axial flows of hot and cold fluid, respectively, into chambers 44a-b, which are also rotated with respect to the casing 41 and the outlets 45a-f, thereby causing each of the outlets 45a-f to alternately output hot and cold fluid pulses. The rotational speed controls the wavelength and frequency of the hot and cold fluid pulses and the angular separation of the outlets controls the phase.

In FIG. 3, the blades 43 are oriented so that hot fluid is output through the outlets 44a-c from the chamber 44a, which receives hot fluid, whereas cold fluid is output through the outlets 44d-f from the chamber 44b, which receives cold fluid. As the blades are rotated clockwise, the outlet 45a switches from outputting hot fluid to outputting cold fluid, while, the outlet 45d switches from outputting cold fluid to outputting hot fluid, etc.

The rotating valve has generally at least two outlets, and has preferably an even number of outlets in order to minimize pressure gradients and variations. For the particular embodiment shown in FIG. 2, the rotating valve for alternately outputting hot and cold fluid has three outlets.

Further, the rotating valve may comprise four or more blades, and, as a consequence, four or more chambers alternately connected to hot and cold fluid. Hereby, the frequency of the temperature variation can be increased.

While the above rotating valve has been described as receiving hot and cold fluid in different chambers and outputting hot and cold fluid alternately in each of a plurality of outlets at the circumference of the rotating valve, it is equally applicable to a rotating valve such as the rotating valve 29 of FIG. 2, i.e. a rotating valve which receives hot and cold fluid alternately in each of a plurality of inlets at the circumference of the rotating valve and which outputs hot and cold fluid axially via different chambers.

To fit the embodiment of FIG. 2 each of the rotating valves should advantageously have three inlets/outlets at the circumference thereof.

Figure 4:
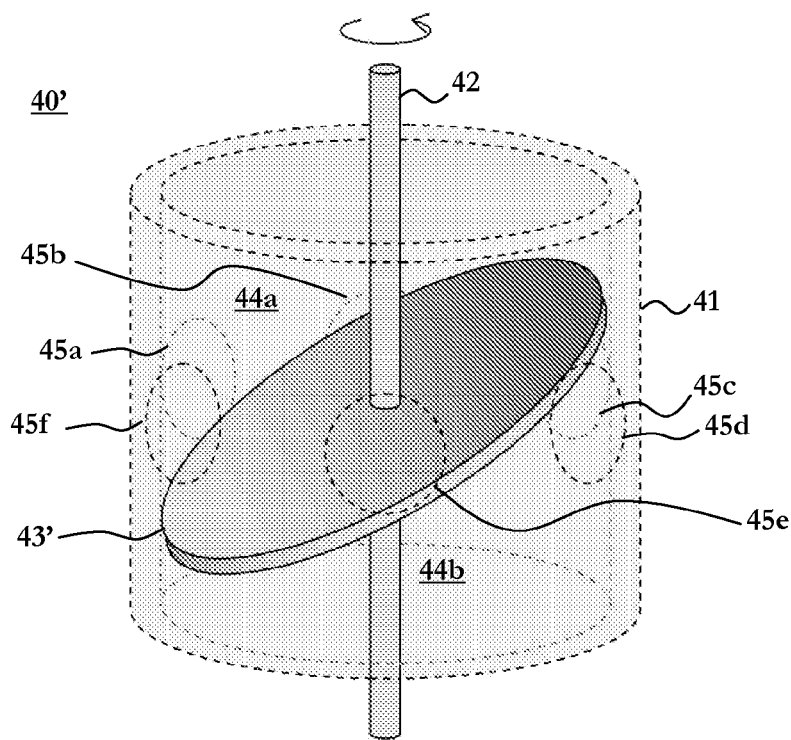
FIG. 4 displays schematically in a perspective view another example of a rotating valve as usable in the thermomagnetic generator device of FIG. 2.

An alternative example of a rotating valve 40' to be used in the present invention, which is disclosed in FIG. 4, differs from the rotating valve of FIG. 3 in that the blades 43 are exchanged for an elliptic disc 43', which is fixedly attached to the shaft 42 in an inclined position. The elliptic disc 43' is arranged in close fit with the cylindrical casing 41, to define the first and second chambers 44a-b. The elliptic disc 43' is arranged at an axial position and with an inclination angle such that each of the outlets/inlets 45a-f at the circumference of the cylindrical casing 41 is alternately in fluid connection with the first and second chamber 44a-b as the shaft 42 and the elliptic disc 43' are rotated with respect to the cylindrical casing 41. Each of the axial ends of the rotating valve 40' may, similar as those of the rotating valve 40 of FIG. 3, be connected to a respective one of the first and second intermediate pipe arrangement 25, 27.

The elliptic plate might be fabricated by cutting it from a predrilled solid cylinder having a diameter slightly less than the inner diameter of the cylindrical casing.

A large number of outlets minimizes possible pressure variations associated with the elliptic disc 43' sweeping by an outlet. During the peak of such an event the disc 43' may, depending on the actual design chosen, cover either the full outlet area (some unsteadiness has be tolerated in the outlet flow) or only part of it (some mixing has to be tolerated in the outlet flow). Due to symmetry, the forces acting on the disc 43' and the shaft 42 are foreseen to be small, provided the fluid pressure is equal in the two chambers. Also, for the same reason, a small separation between the disc 43' and the wall of the cylindrical casing 41 may be allowed, reducing or eliminating solid-to-solid contact forces with only negligible amounts of fluid being mixed.

The disc 43' may be suitable reshaped, e.g. by means of bulging, bending, and/or twisting, thereby requiring a shape other than elliptical, for self-propulsion of the shaft/disc combination in the flow.

The rotating valves as have been described with reference to FIGS. 3 and 4 are capable of distributing industrial scale amounts of fluids with different characteristics to a common outlet (or several common outlets) with minimal mixing on a sub-second scale. The rotating valves allow for a steady fluid flow with minimal disturbance from switching, minimal switching power demand, and a long lifetime with the ability to switch millions of cycles. Conventional valves and piston pumps either are too slow, too disruptive (flow stop, pressure waves), power demanding and/or wear out after rather short a number of cycles.

The rotating valves can thus not only be used for the application of producing trains of hot and cold fluid pulses, but are applicable for a large variety of industrial processes which involve alternating distribution of fluid with different characteristics into a common outlet, keeping the fluids separated with minimal mixing at a rate of a few cycles per second, continuously for several years. The fluids have preferably roughly similar fluid properties concerning e.g. density, viscosity, etc. They may consist of different substances, like water and ethanol, or of the same substance in different property states, like hot and cold water.

By the temperature-varying device 5 as being described above with reference to FIG. 2, thermal cycling in a quasi-continuous or continuous manner is enabled. By means of having the fluid to circulate in a uni-directional closed loop the traditional disruptive and energetically inefficient cycling using valves switching on and off the fluid flow is entirely avoided. Nevertheless, the rotating valves may be exchanged for an arrangement of ordinary valves that are opened or closed in order to obtain the operation depicted above.

The smooth continuous thermal cycling described above may equally well be implemented in a two-phase generator device or even in a single-phase generator device. In the latter case still two rotating valves are required, each having two inlets/outlets arranged circumferentially at the valve casing. One of the alternately hot and cold fluid flows output from the outlets are either connected directly to the return rotating valve phase or is appropriately delayed and then brought together with the other one of the alternately hot and cold fluid flows to obtain a single flow of alternately hot and cold fluids with a double flow rate. Pressure differences between the different ones of the alternately hot and cold fluid flows may advantageously be balanced by an additional circulation pump.

The fluid used in the inner closed loop may be water or any other fluid, optionally to which additives have been added. Additives that reduce corrosion with respect to the magnetic material may be added. Other additives, such as thermal salts or similar with a phase transition adjusted to the phase transition temperature of the magnetic material to thereby increase the heat capacity of the fluid, may additionally or alternatively be added.

Preferably, the magnetic material is gadolinium or an alloy comprising gadolinium. Alternatively, the magnetic material with the suitable phase transition temperature is any of bismuth, zinc, antimony, tellurium, selenium, lead, silicon, germanium, tin, magnesium, manganese, arsenic, nickel, lanthanum, gallium, phosphorus, calcium, barium, strontium, ytterbium, iron or any alloy or compound thereof. Note that not all of the above elements are magnetic, but can in such instance be used with a magnetic material to modify its magnetic phase transition characteristics. Some of the above elements may be present in the magnetic material of the invention as an oxide, or in any other kind of chemical compound.

The multiphase generator device of FIG. 2 comprises further advantageously a power conversion device connected to the capacitors 9 of the three generator units or phases at the output. The coils 7 and the power conversion device are controlled to match the cycle of the thermal variation and to thereby enable optimum energy to be tapped from the circuit. The power conversion device may comprise an AC/DC or AC/AC frequency converter or a power electronic converter including a current or voltage source converter 36, which encompasses a rectifier and an inverter at the DC side of the rectifier.

Additionally, or alternatively, a battery is connected at the DC side. This is particularly advantageous if the power output from the generator is very fluctuating.

A transformer 37 is connected to the output of the voltage source converter 36 to transform the output voltage and frequency of about 1 kV and 1 Hz from the multiphase generator to a frequency and a voltage (50 Hz, 10 kV) suitable for normal grid connection. The rating of the equipment is typically larger than 1 kW.

Preferably, the generator device of the present invention is provided for electric power generation in the range of 100 kW to 50 MW, and more preferably in the range of 1-5 MW. Several generator devices may be arranged together as modules to generate electric powers of about 10-50 MW.

A plant control system may be provided for measuring the performance of the generator device and optimizing the power output, e.g. as was described with reference to FIG. 1. Further sensor devices 38 may be provided for measuring flow rates or pressure of the temperature varying fluid, and the control system may be provided for controlling the flow rates of the temperature varying fluids as well as the speeds of the rotating valves.

The generator device described above is capable of performing active control of the oscillations in the electric resonance circuits in order to obtain optimum correlation with the temperature changes of the magnetic material. Active power can be output in optimum synchronization with the cycles.

The provision of inner and outer parts separated from one another is not necessary. For instance, the hot fluid may be taken directly from e.g. a (hydro)thermal bore hole and be returned via a secondary or return bore hole.

Figure 5:
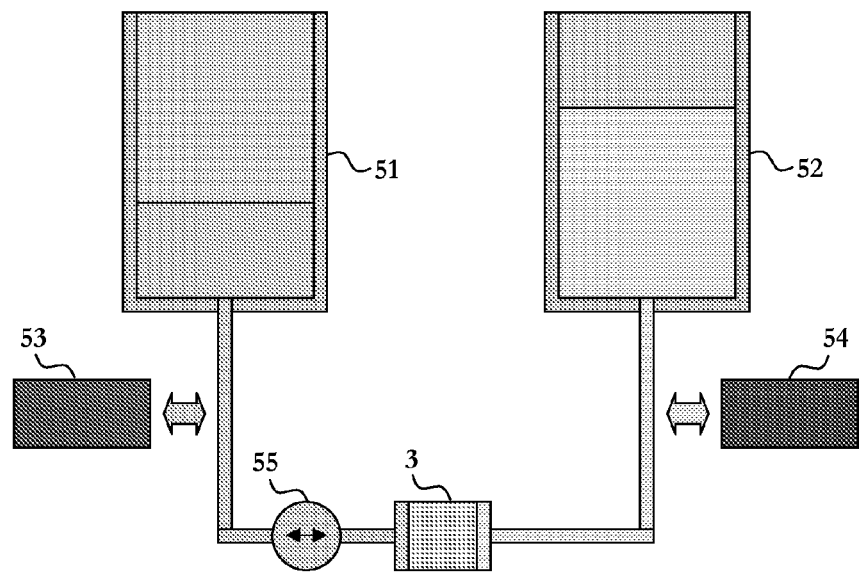
FIG. 5 displays schematically in a side view a temperature varying device usable in a thermomagnetic generator device of the invention.

With reference next to FIG. 5 a further embodiment of a temperature varying device for use in a thermomagnetic generator device of the invention will be disclosed. The embodiment uses the principle of oscillating a fluid between two vertical fluid columns that store mechanical energy of the fluid.

The embodiment comprises preferably two containers 51, 52 arranged above the magnetic material 3 with the suitable phase transition temperature of the magnetic circuit of the generator device. The two containers 51, 52 are in fluid communication with one another via the magnetic material 3. A source of heat 53 is configured to heat fluid in or adjacent one 51 of the containers and a source of cold 54 is configured to cool fluid in or adjacent another one 52 of the containers. The fluid is oscillating back and forth with alternately hot and cold fluid coming into contact with the magnetic material 3 to heat and cool the magnetic material alternately above and below a phase transition temperature of the magnetic material. A pump 55 or other feed device is provided to add energy that is lost due to friction to keep the amplitude up of the oscillating fluid.

A yet further embodiment of a temperature varying device for use in a thermomagnetic generator device of the invention comprises oscillating a fluid in a closed circuit by means of a piston and optionally using springs to store the mechanical energy. A suitable driving mechanism via e.g. magnetic induction is suitably used to compensate for frictional losses.

Figure 6:
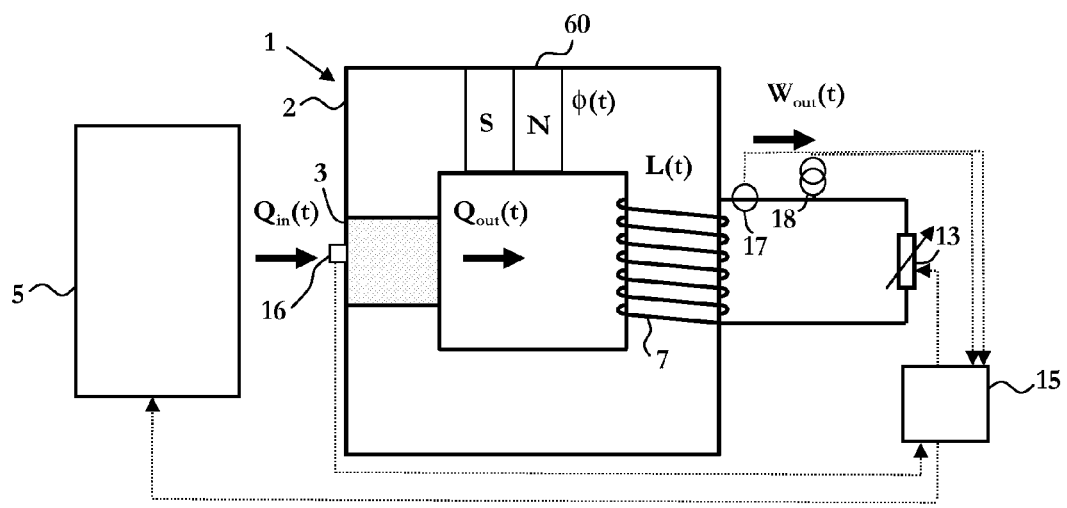
FIG. 6 displays schematically a thermomagnetic generator device according to yet a further embodiment of the present invention.

With reference next to FIG. 6 a thermomagnetic generator device according to yet a further embodiment of the present invention differs from the embodiment of FIG. 1 in that the magnetic circuit comprises a permanent magnet 60, which is provided for creating a magnetic flux $\phi(t)$ in the magnetic circuit 1, which is modulated by the varying reluctance caused by the variation of the temperature in the portion made of the magnetic material with the suitable phase transition temperature alternately above and below the magnetic phase transition temperature of the magnetic material.

The capacitor 9 and one of the current transformers 17 may be dispensed with. In other respects the embodiment of FIG. 6 may be similar to the embodiment of FIG. 1.

It shall be appreciated that in a thermomagnetic generator device according to still a further embodiment of the invention (not illustrated) the permanent magnet 60 is exchanged for a separate coil and current feeding, thereby forming an electromagnet for magnetizing the magnetic circuit 1.

The generator device of the present invention is advantageously used for the generation of electric power by using any of waste heat, combustion heat, thermal storage reservoir energy, geothermal energy, solar radiation, solar thermal energy, or ocean thermal energy.

The invention claimed is:

1. A generator device for converting thermal energy to electric energy, comprising:
a magnetic circuit including at least a portion made of a magnetic material;
a temperature-varying device configured to vary a temperature in said portion made of the magnetic material alternately above and below a phase transition temperature of the magnetic material to thereby vary a reluctance of the magnetic circuit;
a coil arranged around said magnetic circuit, in which electric energy is induced in response to a varying magnetic flux in said magnetic circuit;
a magnetic flux generator configured to create a magnetic flux in said magnetic circuit;
a controllable electric circuit device connected to said coil; and
a control device provided for controlling the controllable electric circuit device,
wherein said electric circuit device is configured to control a voltage and a current so as to have an inductive or capacitive component, and a resistive component, each of which being separately and individually controllable, and said control device is provided for separately controlling the inductance/capacitance and the resistance of the controllable electric circuit device.

2. A generator device for converting thermal energy to electric energy, comprising:
a magnetic circuit including at least a portion made of a magnetic material;
a temperature-varying device configured to vary a temperature in said portion made of the magnetic material alternately above and below a phase transition temperature of the magnetic material to thereby vary a reluctance of the magnetic circuit;

a coil arranged around said magnetic circuit, in which electric energy is induced in response to a varying magnetic flux in said magnetic circuit;

a magnetic flux generator configured to create a magnetic flux in said magnetic circuit;

a controllable electric circuit device connected to said coil; and a control device provided for controlling the controllable electric circuit device, wherein said electric circuit device has an impedance, the amplitude and phase of which are dynamically controllable, and said control device is provided for dynamically controlling the amplitude and phase of the controllable electric circuit device.

3. A generator device for converting thermal energy to electric energy, comprising:

a magnetic circuit including at least a portion made of a magnetic material;

a temperature-varying device configured to vary a temperature in said portion made of the magnetic material alternately above and below a phase transition temperature of the magnetic material to thereby vary a reluctance of the magnetic circuit;

a coil arranged around said magnetic circuit, in which electric energy is induced in response to a varying magnetic flux in said magnetic circuit;

a magnetic flux generator configured to create a magnetic flux in said magnetic circuit;

a controllable electric circuit device connected to said coil;

a control device provided for controlling the controllable electric circuit device; and voltage and/or current sensor configured to instantaneously measure a voltage and/or current in or at the coil, wherein said control device is provided for controlling the controllable electric circuit device in response to said measured voltage and/or current.

4. A generator device for converting thermal energy to electric energy, comprising:

a magnetic circuit including at least a portion made of a magnetic material;

a temperature-varying device configured to vary a temperature in said portion made of the magnetic material alternately above and below a phase transition temperature of the magnetic material to thereby vary a reluctance of the magnetic circuit;

a coil arranged around said magnetic circuit, in which electric energy is induced in response to a varying magnetic flux in said magnetic circuit;

a magnetic flux generator configured to create a magnetic flux in said magnetic circuit;

a controllable electric circuit device connected to said coil; and a control device provided for controlling the controllable electric circuit device, wherein the amplitude and frequency of the variation of the temperature in said portion made of the magnetic material alternately above and below the phase transition temperature of the magnetic material as performed by the temperature-varying device is controllable and said control device is provided for controlling the amplitude and frequency of the variation of the temperature in said portion made of the magnetic material alternately above and below the phase transition temperature of the magnetic material.

5. A generator device for converting thermal energy to electric energy, comprising:

a magnetic circuit including at least a portion made of a magnetic material;

a temperature-varying device configured to vary a temperature in said portion made of the magnetic material alternately above and below a phase transition temperature of the magnetic material to thereby vary a reluctance of the magnetic circuit;

a coil arranged around said magnetic circuit, in which electric energy is induced in response to a varying magnetic flux in said magnetic circuit;

a magnetic flux generator configured to create a magnetic flux in said magnetic circuit;

a controllable electric circuit device connected to said coil;

a control device provided for controlling the controllable electric circuit device; and a sensor device provided for measuring a flow rate or a pressure of the alternately hot and cold fluid, wherein said control device is provided for controlling the flow rate of the alternately hot and cold fluid in response to said sensed flow rate or pressure, wherein the temperature-varying device is configured to alternately pass hot and cold fluid by, or through holes in, the portion made of the magnetic material of the magnetic circuit to thereby vary the temperature in said portion made of the magnetic material alternately above and below the phase transition temperature of the magnetic material.

6. The generator device according to claim 1, further comprising:

an AC/AC frequency converter connected to said coil.

7. The generator device according to claim 1, further comprising:

a power electronic converter connected to said coil.

8. The generator device according to claim 6, wherein said converter comprises a voltage source converter and/or a current source converter.

9. The generator device according to claim 1, further comprising:

an AC/DC converter connected to said coil.

10. The generator device according to claim 7, wherein said converter comprises a voltage source converter and/or a current source converter.

* * * * *